(12) United States Patent
Akiyama et al.

(10) Patent No.: US 10,781,104 B2
(45) Date of Patent: Sep. 22, 2020

(54) COMPOSITE SUBSTRATE, METHOD FOR FORMING NANOCARBON FILM, AND NANOCARBON FILM

(71) Applicant: Shin-Etsu Chemical Co., Ltd., Tokyo (JP)

(72) Inventors: Shoji Akiyama, Annaka (JP); Yoshihiro Kubota, Annaka (JP); Makoto Kawai, Annaka (JP); Shigeru Konishi, Annaka (JP); Hiroshi Mogi, Tokyo (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 518 days.

(21) Appl. No.: 15/534,652

(22) PCT Filed: Dec. 16, 2015

(86) PCT No.: PCT/JP2015/085237
§ 371 (c)(1),
(2) Date: Jun. 9, 2017

(87) PCT Pub. No.: WO2016/104291
PCT Pub. Date: Jun. 30, 2016

(65) Prior Publication Data
US 2018/0265360 A1    Sep. 20, 2018

(30) Foreign Application Priority Data
Dec. 22, 2014    (JP) .................................. 2014-258810

(51) Int. Cl.
*C01B 32/184*    (2017.01)
*C01B 32/956*    (2017.01)
(Continued)

(52) U.S. Cl.
CPC .............. *C01B 32/184* (2017.08); *B32B 9/00* (2013.01); *B32B 9/005* (2013.01); *B32B 9/04* (2013.01);
(Continued)

(58) Field of Classification Search
CPC ..... C01B 32/184; C01B 32/05; C01B 32/956; C01B 2204/30; B32B 9/005; B32B 9/04;
(Continued)

(56) References Cited

U.S. PATENT DOCUMENTS 5,876,861 A  *  3/1999  Kondo et al. ......... C23C 14/025
                                                     428/641
2015/0262862 A1    9/2015  Kawai et al.
(Continued)

FOREIGN PATENT DOCUMENTS

EP    3229260 A1    10/2017
JP    63-303896 A   12/1988
(Continued)

OTHER PUBLICATIONS

Machine Translation of JP 2011086660 to Nishiguchi, et al. (Year: 2011).*
(Continued)

*Primary Examiner* — Daniel C. McCracken
(74) *Attorney, Agent, or Firm* — Westerman, Hattori, Daniels & Adrian, LLP (57) ABSTRACT

Provided is a composite substrate which is provided with: a single crystal silicon carbide thin film 11 having a thickness of 1μm or less; a handle substrate 12 which supports the single crystal silicon carbide thin film 11 and is formed from a heat-resistant material (excluding single crystal silicon carbide) having a heat resistance of not less than 1,100° C.; and an intervening layer 13 which has a thickness of 1μm or less and is arranged between the single crystal silicon
(Continued)

carbide thin film 11 and the handle substrate 12, and which is formed from at least one material selected from among silicon oxide, silicon nitride, aluminum oxide, aluminum nitride, zirconium oxide, silicon and silicon carbide, or from at least one metal material selected from among Ti, Au, Ag, Cu, Ni, Co, Fe, Cr, Zr, Mo, Ta and W. This composite substrate according to the present invention enables the formation of a nanocarbon film having few defects at low cost.

11 Claims, 3 Drawing Sheets

(51) Int. Cl.
| | |
|---|---|
| H01L 21/265 | (2006.01) |
| H01L 29/06 | (2006.01) |
| B32B 15/04 | (2006.01) |
| H01L 21/02 | (2006.01) |
| B32B 9/00 | (2006.01) |
| C01B 32/05 | (2017.01) |
| B32B 9/04 | (2006.01) |
| B32B 37/18 | (2006.01) |
| B32B 38/00 | (2006.01) |
| C30B 29/36 | (2006.01) |
| H01L 29/16 | (2006.01) |
| H01L 29/34 | (2006.01) |
| B82Y 30/00 | (2011.01) |
| B82Y 40/00 | (2011.01) |

(52) U.S. Cl.
CPC .............. *B32B 15/04* (2013.01); *B32B 37/18* (2013.01); *B32B 38/0008* (2013.01); *B32B 38/0012* (2013.01); *C01B 32/05* (2017.08); *C01B 32/956* (2017.08); *C30B 29/36* (2013.01); *H01L 21/02* (2013.01); *H01L 21/02378* (2013.01); *H01L 21/02527* (2013.01); *H01L 21/02631* (2013.01); *H01L 21/265* (2013.01); *H01L 29/06* (2013.01); *H01L 29/1606* (2013.01); *H01L 29/34* (2013.01); *B32B 2038/0016* (2013.01); *B32B 2250/02* (2013.01); *B32B 2255/20* (2013.01); *B32B 2255/205* (2013.01); *B32B 2310/14* (2013.01); *B32B 2311/04* (2013.01); *B32B 2315/02* (2013.01); *B32B 2457/14* (2013.01); *B82Y 30/00* (2013.01); *B82Y 40/00* (2013.01); *C01B 2204/30* (2013.01); *Y10S 977/734* (2013.01); *Y10S 977/842* (2013.01)

(58) Field of Classification Search
CPC . B32B 37/18; B32B 38/0008; B32B 38/0012; B32B 2038/0016; B32B 2250/02; B32B 2255/20; B32B 2255/205; B32B 2310/14; B32B 2311/04; B32B 2315/02; B32B 2457/14; B32B 9/00; B32B 15/04; B32B 9/007; B32B 9/041; B32B 2307/306; C30B 29/36; H01L 21/02378; H01L 21/02527; H01L 21/02631; H01L 29/1606; H01L 29/34; H01L 21/265; H01L 21/02; H01L 29/06; H01L 21/02529; H01L 29/0665; B82Y 10/00; B82Y 30/00; B82Y 40/00; Y10S 977/734; Y10S 977/842

See application file for complete search history.

(56) References Cited

U.S. PATENT DOCUMENTS

| | | |
|---|---|---|
| 2015/0303097 A1 | 10/2015 | Konishi et al. |
| 2017/0330747 A1 | 11/2017 | Akiyama |

FOREIGN PATENT DOCUMENTS

| | | | | |
|---|---|---|---|---|
| JP | 5-13616 | A | 1/1993 | |
| JP | 2000-117046 | A | 4/2000 | |
| JP | 2005-347666 | A | 12/2005 | |
| JP | 2011-86660 | A | 4/2011 | |
| JP | 2011086660 | * | 4/2011 | ............ H01L 21/02 |
| JP | 2012-153576 | A | 8/2012 | |
| JP | WO2014/061337 | A1 | 4/2014 | |
| WO | 2014/080874 | A1 | 5/2014 | |

OTHER PUBLICATIONS

Silicon Carbide, SiC Ceramic Properties, accessed online at https://accuratus.com/silicar.html on Feb. 28, 2020, © 2013 (Year: 2013).*
Extended (supplementary) European Search Report dated Jun. 8, 2018, issued in counterpart European Application No. 15872860.0. (8 pages).
Hwang et al., "CVD growth of SiC on sapphire substrate and graphene formation from the epitaxial SiC", Journal of Crystal Growth, vol. 366, pp. 26-30, 2013. (cited in ISR).
International Search Report dated Jan. 26, 2016, issued in counterpart International Application No. PCT/JP2015/085237 (2 pages).

* cited by examiner

BONDING FOLLOWING SURFACE ACTIVATION TREATMENT

FIG.2D

EXFOLIATION

FIG.2E

POLISHING OF SINGLE-CRYSTAL SILICON CARBIDE THIN FILM

COMPOSITE SUBSTRATE, METHOD FOR FORMING NANOCARBON FILM, AND NANOCARBON FILM

TECHNICAL FIELD

The present invention relates to a composite substrate that enables the production of a nanocarbon film, a method for producing a nanocarbon film using the composite substrate, and a nanocarbon film.

BACKGROUND ART

In recent years, nanocarbons such as graphenes, fullerenes and carbon nanotubes have been attracting attention as novel electronic device materials. Graphenes, for example, because they possess such properties as an exceedingly high mobility (reportedly 100 times that of silicon) and a durability higher than that of steel, are under study as a platform for next-generation electronic devices.

Several methods of forming nanocarbon have been proposed, including, for instance, a sublimation process. This is a process in which single-crystal silicon carbide (SiC) is treated at an elevated temperature in an inert gas, causing the silicon (Si) within the silicon carbide to vaporize; the carbon (C) that remains behind forms graphene (JP-A 2007-335532 (Patent Document 1)). This process has been in the spotlight recently as a way of obtaining a graphene wafer from a single-crystal silicon carbide wafer (maximum diameter, 6 inches). With regard to fullerenes and carbon nanotubes as well, it is increasingly likely that high-quality films of these materials will be formed using single-crystal silicon carbide as the platform substrate.

However, the increased cost arising from the use of very expensive single-crystal silicon carbide wafers is a drawback. The price of semi-insulating single-crystal silicon carbide wafers in particular, which are regarded as important in electronic device applications, is on the order of several hundred thousand yen for a single wafer having a diameter of about 3 inches, making them too expensive for widespread use.

Patent Document 2 (JP-A 2009-200177) teaches a method of forming graphene on a single-crystal silicon carbide (SiC) substrate and then transferring the graphene, over an intervening bonding layer, onto a handle wafer (which is composed of a material that contains silicon but does not contain carbon). However, because the graphene layer formed by this method (generally having a nanometer order thickness) is peeled from the single-crystal SiC substrate and transferred, considerable damage is incurred, making it difficult to obtain high-quality graphene.

The prior art relating to this invention includes also WO 2014/061337 (Patent Document 3).

PRIOR ART DOCUMENTS

Patent Documents

Patent Document 1: JP-A 2007-335532
Patent Document 2: JP-A 2009-200177
Patent Document 3: WO 2014/061337

SUMMARY OF THE INVENTION

Problems to be Solved by the Invention

The present invention was arrived at in light of the above circumstances. The objects of the invention are to provide a composite substrate that enables the production of a nanocarbon film having few defects at low cost, a method for producing a nanocarbon film, and a nanocarbon film.

Means for Solving the Problems

In order to solve these problems, the inventors earlier proposed a low-cost, high-quality composite substrate having the following sort of structure for the purpose of forming a nanocarbon film. That is, because the single-crystal silicon carbide layer that is to be graphenized need only be several atomic layers thick, making a thick silicon carbide layer unnecessary, a single-crystal silicon carbide thin film formed on a handle substrate (e.g., a non-single-crystal silicon carbide wafer) is typically prepared. Such a substrate can be prepared by transferring a single-crystal silicon carbide thin film from a single-crystal silicon carbide wafer to a handle substrate. Moreover, because single-crystal silicon carbide thin films can be repeatedly transferred from one single-crystal silicon carbide wafer, the cost advantages are greatly increased. However, silicon carbide is very hard, and so it is not easy in a polishing step to obtain a surface roughness suitable for bonding. By providing an intervening layer that is easy to polish between the single-crystal silicon carbide thin film and the handle substrate, the surface roughnesses of the faces to be bonded are easily reduced, resulting in strong bonding (adhesion) between the single-crystal silicon carbide thin film and the handle substrate.

When a nanocarbon film is formed using a compound substrate having such a structure, defects sometimes arise in the single-crystal silicon carbide thin film or in the nanocarbon film that is formed there. Upon close examination, it was found that such defects tend to arise when the intervening layer is thick, with defects occurring particularly when the thickness of the intervening layer exceeds 1 μm. This is thought to be due to strain that arises from the difference between the coefficient of expansion of the intervening layer itself and the coefficient of expansion of the single-crystal silicon carbide thin film. Further examination revealed that the defects that arise in the single-crystal silicon carbide thin film and the nanocarbon film are effectively suppressed when the single-crystal silicon carbide thin film to be bonded is itself thin.

The inventors have conducted extensive investigations based on these findings, ultimately arriving at the present invention.

Accordingly, the invention provides the following composite substrates, method of forming a nanocarbon film, and nanocarbon film.

[1] A composite substrate comprising a single-crystal silicon carbide thin film having a thickness of not more than 1 μm, a handle substrate which supports the single-crystal silicon carbide thin film and is made of a heat-resistant material (exclusive of single-crystal silicon carbide) that is heat resistant to at least 1,100° C., and an intervening layer having a thickness of not more than 1 μm that is provided between the single-crystal silicon carbide thin film and the handle substrate and is made of at least one metallic material selected from the group consisting of titanium, gold, silver, copper, nickel, cobalt, iron, chromium, zirconium, molybdenum, tantalum and tungsten.

[2] The composite substrate of [1], wherein the handle substrate is made of amorphous silicon carbide, polycrystalline silicon carbide, quartz glass, sapphire, silicon nitride, aluminum nitride, silicon or diamond.

[3] A composite substrate comprising a single-crystal silicon carbide thin film having a thickness of not more than 1

μm, a handle substrate which supports the single-crystal silicon carbide thin film and is made of a heat-resistant material (exclusive of single-crystal silicon carbide) that is heat resistant to at least 1,100° C., and an intervening layer having a thickness of not more than 1 μm that is provided between the single-crystal silicon carbide thin film and the handle substrate and is made of at least one material selected from the group consisting of silicon oxide, silicon nitride, aluminum oxide, aluminum nitride, zirconium oxide, silicon and silicon carbide.

[4] The composite substrate of [3], wherein the handle substrate is made of amorphous silicon carbide, polycrystalline silicon carbide or quartz glass.

[5] The composite substrate of any one of [1] to [4], wherein the single-crystal silicon carbide thin film is formed from a single-crystal silicon carbide substrate by exfoliation of a portion thereof.

[6] A method of forming a nanocarbon film, comprising the step of heating the composite substrate of [1] or [2] and thereby sublimating silicon atoms from the single-crystal silicon carbide thin film so as to obtain a nanocarbon film.

[7] A method of forming a nanocarbon film, comprising the step of heating the composite substrate of [3] or [4] and thereby sublimating silicon atoms from the single-crystal silicon carbide thin film so as to obtain a nanocarbon film.

[8] A nanocarbon film obtained by the nanocarbon film-forming method of [6] or [7].

[9] The nanocarbon film of [8], wherein the number of defects found by surface examination under an optical microscope at 1,000× is not more than 4,000 defects/cm$^2$.

Advantageous Effects of the Invention

One advantage of the invention is that, by placing an intervening layer which has a thickness of not more than 1 μm and is made of a given material between a single-crystal silicon carbide thin film having a thickness of not more than 1 μm and a handle substrate, a composite substrate in which the single-crystal silicon carbide thin film is bonded so as to adhere well to the handle substrate can be provided and a nanocarbon film having few defects can be formed at this composite substrate. A further advantage is that, by transferring a single-crystal silicon carbide film in the state of a thin-film to a handle substrate, the need to prepare a large number of costly single-crystal silicon carbide substrates is eliminated, making it possible to provide a composite substrate that enables the formation of nanocarbon films at low cost.

BRIEF DESCRIPTION OF THE DIAGRAMS

FIG. 2 shows schematic diagrams depicting a number of steps in a method for producing the composite substrate of the invention, FIG. 2A being a sectional view of an ion-implanted single-crystal silicon carbide substrate, FIG. 2B being a sectional view showing a thin film formed on the ion implantation side of the single-crystal silicon carbide substrate, FIG. 2C being a sectional view showing a thin film formed on a principal surface of a handle substrate, FIG. 2D being a sectional view showing the single-crystal silicon carbide substrate and the handle substrate bonded together, FIG. 2E being a sectional view showing a single-crystal silicon carbide substrate exfoliated at an ion implant region, and FIG. 2F being a sectional view of the composite substrate.

EMBODIMENT FOR CARRYING OUT THE INVENTION

[Composite Substrate]

The composite substrate according to the invention is described below.

Figure 1:
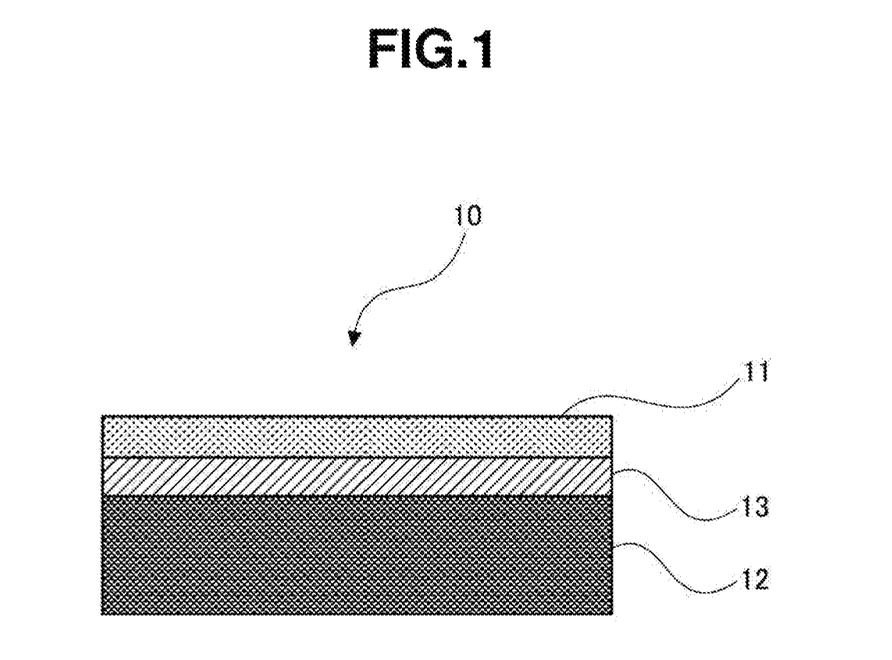
FIG. 1 is sectional view showing the construction of a composite substrate according to this invention.

Referring to FIG. 1, the composite substrate 10 according to this invention has a single-crystal silicon carbide thin film 11 with a thickness of not more than 1 μm, a handle substrate 12 which supports the single-crystal silicon carbide thin film 11 and is made of a heat-resistant material (exclusive of single-crystal silicon carbide) that is heat resistant to at least 1,100° C., and an intervening layer 13 having a thickness of not more than 1 μm that is provided between the single-crystal silicon carbide thin film 11 and the handle substrate 12 and is made of at least one material selected from silicon oxide, silicon nitride, aluminum oxide, aluminum nitride, zirconium oxide, silicon and silicon carbide, or at least one metallic material selected from titanium, gold, silver, copper, nickel, cobalt, iron, chromium, zirconium, molybdenum, tantalum and tungsten.

The single-crystal silicon carbide thin film 11, as subsequently described, is formed by thin-film or layer exfoliation from bulk single-crystal silicon carbide, such as a single-crystal silicon carbide substrate having the crystal structure 4H-SiC, 6H-SiC or 3C-SiC.

The single-crystal silicon carbide thin film 11 is a thin film that is made of single-crystal silicon carbide and has a thickness of not more than 1μm, preferably at least 100 nm and not more than 1 μm, more preferably at least 200 nm and not more than 800 nm, and even more preferably at least 300 nm and not more than 500 nm. At a single-crystal silicon carbide thin film 11 thickness larger than 1 μm, when a nanocarbon film is formed by heating this composite substrate 10, numerous defects end up arising in the nanocarbon film. On the other hand, at a thickness below 100 nm, achieving a uniform thickness distribution is not easy and forming the nanocarbon film may be difficult.

The handle substrate 12 is made of a material that withstands the heat treatment temperature during nanocarbon film formation; that is, a heat-resistant material (exclusive of single-crystal silicon carbide) that is heat resistant to at least 1,100° C. For example, preferred use can be made of silicon carbide that is not single-crystalline (i.e., amorphous silicon carbide or polycrystalline silicon carbide), or of quartz glass, sapphire, crystalline silicon (single-crystal silicon or polycrystalline silicon), silicon nitride, diamond or aluminum nitride. Of these, amorphous silicon carbide, polycrystalline silicon carbide or quartz glass is more preferred. It is even more preferable for the handle substrate 12 to be made of amorphous silicon carbide or polycrystalline silicon carbide, each of which has a coefficient of thermal expansion close to that of single-crystal silicon carbide and therefore possesses a good heat resistance to the heat treatment carried out during nanocarbon formation. The thickness of the handle substrate 12 is not particularly limited, although an ordinary thickness in the vicinity of the SEMI standards or JEDIA standards is desirable in terms of handleability.

The intervening layer 13 is a layer that is provided between the single-crystal silicon carbide thin film 11 and the handle substrate 12, and serves to bond the two together so that they adhere well. It is a thin film made of, for example, at least one material selected from silicon oxide, silicon nitride, aluminum oxide, aluminum nitride, zirconium oxide, silicon and silicon carbide, or a thin film made of at least one metallic material selected from titanium, gold, silver, copper, nickel, cobalt, iron, chromium, zirconium, molybdenum, tantalum and tungsten. When a plurality of materials are selected from the foregoing materials, the intervening layer 13 may have a structure in which these materials are stacked as discrete layers or may have a single-layer structure made of a mixture of these materials.

The intervening layer 13 has a thickness of not more than 1 μm, preferably at least 2 nm and not more than 1μm, more preferably at least 0.02 μm and not more than 0.5 μm, and even more preferably at least 0.05 μm and not more than 0.2 μm. At an intervening layer 13 thickness greater than 1 μm, when a nanocarbon film is formed by heating the composite substrate 10, numerous defects end up arising in the nanocarbon film. On the other hand, at a thickness below 2 nm, adhesion between the single-crystal silicon carbide thin film 11 and the handle substrate 12 may be inadequate.

[Method of Forming Nanocarbon Film]

The composite substrate 10 of the invention is for forming a nanocarbon film. That is, the purpose of the composite substrate 10 is to form a nanocarbon film at the single-crystal silicon carbide thin film 11 which is supported, over the intervening layer 13, by the handle substrate 12, by having silicon atoms sublimate from the single-crystal silicon carbide thin film 11 under heating. More specifically, by heating the composite substrate 10 to preferably at least 1,100° C., more preferably from 1,200 to 1,400° C., and even more preferably from 1,250 to 1,350° C., atoms of silicon (Si) are caused to sublimate from the silicon carbide (SiC) making up the single-crystal silicon carbide thin film 11, enabling a nanocarbon film having a thickness of from about 20 to about 1,000 nm to be formed. The atmosphere in such heat treatment is preferably a vacuum (reduced-pressure) atmosphere because this enables the silicon atoms to readily sublimate. Given that the temperature conditions at this time vary depending on such factors as the atmosphere and the number of workpieces, the temperature is suitably set to the optimal temperature.

Depending on the production conditions and other factors, the nanocarbon film obtained following sublimation has a structure in which fullerenes, graphenes, carbon nanotubes, or a mixture of two or more of these types of nanocarbon, are present. These may be suitably selected according to the intended application.

The nanocarbon film formed on the composite substrate may be employed in various types of electronic devices, although defects in the nanocarbon film adversely affect the performance of electronic devices. It is therefore desired that the number of defects be as low as possible. For example, the number of defects, as determined by examination under an optical microscope at a magnification of 1,000×, is preferably no higher than 4,000 defects/cm$^2$.

A nanocarbon film having few defects can be formed by using the composite substrate 10 of the invention. As used herein, "nanocarbon film defects" refer to localized defects in the nanocarbon film that are associated with defects such as voids in the underlying single-crystal silicon carbide film and can be identified as point-like holes (pits) by examining the nanocarbon film surface under an optical microscope. Also, "few defects in the nanocarbon film" is intended herein to mean that, when the nanocarbon film surface is examined under an optical microscope at a magnification of 1,000×, the number of voids is not more than 3,600/cm$^2$, preferably not more than 3,200/cm$^2$, and more preferably not more than 3,000/cm$^2$.

The thicknesses of the single-crystal silicon carbide thin film 11 and the intervening layer 13 within the composite substrate 10 are values measured by reflectance spectroscopy.

[Method for Producing Composite Substrate]

A method for producing the composite substrate of the invention is described.

Referring to FIG. 2, the method for producing the composite substrate of the invention involves carrying out the steps of, in order: implanting hydrogen ions into a single-crystal silicon carbide substrate (Step 1), forming a thin film on the ion implantation side of the single-crystal silicon carbide substrate (Step 2), forming a thin film on the handle substrate (Step 3), surface activation treating the single-crystal silicon carbide substrate and/or the handle substrate (Step 4), bonding together the single-crystal silicon carbide substrate and the handle substrate (Step 5), exfoliation treatment (Step 6), and polishing the single-crystal silicon carbide thin film (Step 7).

(Step 1: Hydrogen Ion Implantation into Single-Crystal Silicon Carbide Substrate)

Figure 2A:
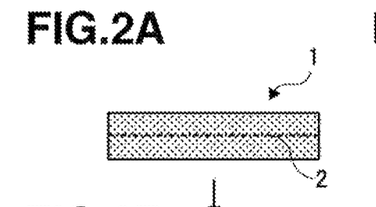

First, hydrogen ions or the like are implanted into the single-crystal silicon carbide substrate 1, thereby forming an ion implant region 2 (FIG. 2A).

Here, the single-crystal silicon carbide substrate 1 to be bonded to the handle substrate 12 is preferably selected from ones having a crystal structure that is 4H-SiC, 6H-SiC or 3C-SiC. The size of the single-crystal silicon carbide substrate 1 and the subsequently described handle substrate 12 is set based on such considerations as the size and cost of the required nanocarbon film. A single-crystal silicon carbide substrate 1 having a thickness in the vicinity of the substrate thickness specified in the SEMI standards or the JEIDA standards is preferable in terms of handleablity. The single-crystal silicon carbide substrate 1 should be a commercially available product, such as a single-crystal silicon carbide wafer that is sold commercially for use in power devices. The use of one whose surface has been finish polished by chemical mechanical polishing (or planarization) (CMP) and has a flat and smooth surface is preferred.

During ion implantation into the single-crystal silicon carbide substrate 1, a predetermined dose of at least hydrogen ions ($H^+$) or molecular hydrogen ions ($H_2^+$) is introduced at an implantation energy that enables the formation of an ion implant region 2 to the desired depth from the surface thereof. With regard to the conditions at this time, the ion implantation energy should be set so as to obtain a thin film of the desired thickness. Helium ions, boron ions and the like may be implanted at the same time; any ions may be used provided the same effects can be obtained.

The ion implantation depth corresponds to the thickness of the single-crystal silicon carbide thin film to be formed.

The dose of hydrogen ions ($H^+$) implanted to the single-crystal silicon carbide substrate 1 is preferably from $1.0 \times 10^{16}$ atoms/cm$^2$ to $9.0 \times 10^{17}$ atoms/cm$^2$. At less than $1.0 \times 10^{16}$ atoms/cm$^2$, embrittlement of the interface may not occur. On the other hand, at more than $9.0 \times 10^{17}$ atoms/cm$^2$, bubbles sometimes form during heat treatment after bonding, resulting in transfer defects.

When molecular hydrogen ions ($H_2^+$) are used as the implanted ions, the dose thereof is preferably from $5.0 \times 10^{15}$ atoms/cm$^2$ to $4.5 \times 10^{17}$ atoms/cm$^2$. At less than $5.0 \times 10^{15}$ atoms/cm$^2$, embrittlement of the interface may not occur, whereas at more than $4.5 \times 10^{17}$ atoms/cm², bubbles sometimes form during heat treatment after bonding, resulting in transfer defects.

The depth to the ion implant region 2 from the surface of the ion-implanted substrate (i.e., the ion implantation depth), which corresponds to the desired depth of the single-crystal silicon carbide thin film 11 to be provided on the handle substrate 12, is from 100 to 1,000 nm, preferably from 200 to 800 nm, and more preferably from 300 to 500 nm. It is desirable for the thickness of the ion implant region 2 (i.e., the ion distribution thickness) to be such as to readily enable exfoliation by mechanical impact or the like; the thickness is preferably from 200 to 400 nm, and more preferably about 300 nm.

An insulating film such as an approximately 50 nm to 500 nm silicon oxide film may be formed beforehand on the surface of the single-crystal silicon carbide substrate 1, and hydrogen ion or molecular hydrogen ion implantation carried out therethrough. A suppressive effect on the channeling of implanted ions can be obtained in this way.

(Step 2: Thin-Film Formation on Ion Implantation Side of Single-Crystal Silicon Carbide Substrate (FIG. 2B))

Figure 2B:
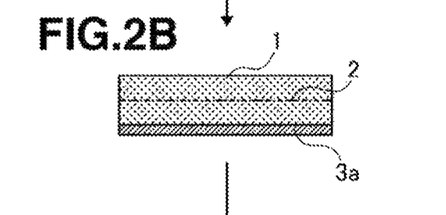

In this step, either Step 2-1 or Step 2-2 below is carried out, thereby forming a thin film 3a on the side of the single-crystal silicon carbide substrate 1 where bonding is to be carried out.

(Step 2-1)

This step forms, on the ion implantation side of the single-crystal silicon carbide substrate 1, a thin film 3a made of a material having heat resistance to the heat treatment subsequently carried out and having a coefficient of thermal expansion that is the same as or close to that of the single-crystal silicon carbide thin film 11 to be ultimately formed. The material making up the thin film 3a may be, for example, one or more material selected from silicon oxide (e.g., $SiO_2$), silicon nitride, aluminum nitride, silicon (e.g., amorphous silicon, polycrystalline silicon), alumina ($Al_2O_3$), zirconium oxide (e.g., zirconia ($ZrO_2$)) and silicon carbide (e.g., amorphous silicon carbide, polycrystalline silicon carbide). Of these materials, zirconium oxide (e.g., zirconia ($ZrO_2$)) and silicon carbide (e.g., amorphous silicon carbide, polycrystalline silicon carbide) are preferred. When a plurality of materials are selected from among these, the thin film 3a may have a structure in which these materials are stacked as discrete layers or may have a single-layer structure consisting of a mixture of these materials.

Any method capable of forming a film that adheres well to the single-crystal silicon carbide substrate 1 may be used to form this thin film 3a. For example, a thin film of silicon oxide may be formed by plasma-enhanced chemical vapor deposition (PECVD), and a thin-film of silicon nitride, aluminum nitride, silicon or silicon carbide may be formed by a sputtering process.

Next, the thin film 3a is polished to make the surface smooth. The thin film 3a polishing method is preferably chemical mechanical polishing, the conditions for which differ according to the thin film 3a material.

(Step 2-2)

A thin film 3a made of at least one metallic material having a melting point of not less than 950° C. and selected from, for example, titanium, gold, silver, copper, nickel, cobalt, iron, chromium, zirconium, molybdenum, tantalum and tungsten is formed on the ion implantation side of the single-crystal silicon carbide substrate 1. When a plurality of metallic materials are selected from these metallic materials, the thin film 3a may have a structure in which these metallic materials are stacked as discrete layers or may have a single-layer structure consisting of an alloy of these metallic materials. Of these materials, at least one selected from titanium, gold and zirconium is preferred, with a single layer of titanium or zirconium, multiple layers consisting of a titanium layer and a gold layer, or multiple layers consisting of a zirconium layer and a gold layer being preferred.

Any method capable of forming a film that adheres well to the single-crystal silicon carbide substrate 1 may be used to form this thin film 3a. For example, the thin film 3a may be formed by electron-beam evaporation.

In this Step 2-2, forming the thin film 3a via vapor deposition of the above metallic material provides by itself (that is, without polishing) a surface that is smooth.

The thickness of the thin film 3a (when polishing is carried out, the film thickness after polishing) is preferably set in such a way that the combined film thickness together with the thin film 3b provided on the handle substrate 12 (i.e., the thickness of the intervening layer 13) is at least 2 nm and not more than 1 μm. That is, when thin films 3a and 3b are made the same thickness, the thickness of thin film 3a is set to preferably at least 1 nm and not more than 0.5 μm (500 nm), more preferably from 10 to 200 nm, even more preferably from 10 to 100 nm, and most preferably from 10 to 50 nm. When a thin film 3b is not provided, the thickness of thin film 3a is set to preferably at least 2 nm and not more than 1 μm, more preferably from 20 to 400 nm, even more preferably from 20 to 200 nm, and most preferably from 20 to 100 nm. At a combined thickness for thin films 3a and 3b of less than 2 nm, the surface is incompletely covered due to in-plane variability in the film thickness, as a result of which adhesion in bonding of the single-crystal silicon carbide substrate 1 with the handle substrate 12 may worsen. On the other hand, at a combined thickness greater than 1 μm, when the composite substrate 10 is heated to form a nanocarbon film, numerous defects arise in the nanocarbon film.

The order of above Steps 1 and 2 may be reversed, with the thin film 3a first being formed on the surface of the single-crystal silicon carbide substrate 1 and ion implantation subsequently being carried out from above this thin film 3a.

(Step 3: Thin Film Formation on Handle Substrate (FIG. 2C))

Figure 2C:
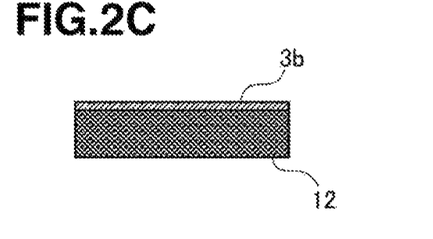

The handle substrate 12 used in this step is the same as the handle substrate within the above-described composite substrate 10.

A thin film 3b made of a material which has heat resistance to the subsequently carried out heat treatment and has a coefficient of thermal expansion that is the same as or close to that of the single-crystal silicon carbide thin film 11 is formed on at least the surface of the handle substrate 12 to be bonded with the single-crystal silicon carbide substrate 1, following which the surface of the thin film 3b is planarized. The same treatment as in above Step 2-1 or Step 2-2 is carried out in this step.

That is, treatment corresponding to Step 2-1 is carried out as follows.

First, a thin film 3b made of at least one material selected from silicon oxide (e.g., $SiO_2$), silicon nitride, aluminum nitride, silicon (e.g., amorphous silicon, polycrystalline silicon), alumina ($Al_2O_3$), zirconium oxide (e.g., zirconia ($ZrO_2$)) and silicon carbide (e.g., amorphous silicon carbide, polycrystalline silicon carbide) is formed on the surface of the handle substrate 12 that is to be bonded with the single-crystal silicon carbide substrate 1. Of these materials, zirconium oxide (e.g., zirconia ($ZrO_2$)) and silicon carbide (e.g., amorphous silicon carbide, polycrystalline silicon carbide) are preferred. When a plurality of materials are selected from these materials, the thin film 3b may have a structure in which these materials are stacked as discrete layers or may have a single-layer structure consisting of a mixture of these materials.

Any method which is capable of forming a film that adheres well to the handle substrate 12 may be used to form this thin film 3b. For example, a thin film of silicon oxide may be formed by PECVD or thermal oxidation, and a thin film of silicon nitride, aluminum nitride, silicon, alumina, zirconium oxide or silicon carbide may be formed by sputtering.

Next, the thin film 3b is polished to make the surface smooth. The thin film 3b polishing method is preferably chemical mechanical polishing, the conditions for which differ depending on the thin film 3b material.

Next, treatment corresponding to Step 2-2 is carried out as follows.

A thin film 3b made of at least one metallic material having a melting point of not less than 950° C. and selected from, for example, titanium, gold, silver, copper, nickel, cobalt, iron, chromium, zirconium, molybdenum, tantalum and tungsten is formed on the side (principal side) of the handle substrate 12 to be bonded with the single-crystal silicon carbide substrate 1. When a plurality of metallic materials are selected from these metallic materials, the thin film 3b may have a structure in which the metallic materials are stacked as discrete layers or may have a single-layer structure consisting of an alloy of these metallic materials. Of these materials, at least one selected from titanium, gold and zirconium is preferred, with a single layer of titanium or zirconium, multiple layers consisting of a titanium layer and a gold layer, or multiple layers consisting of a zirconium layer and a gold layer being preferred.

Any method capable of forming a film that adheres well to the handle substrate 12 may be used to form this thin film 3b. For example, the thin film 3a may be formed by electron-beam evaporation.

In this treatment, forming the thin film 3a via electron-beam evaporation of the above metallic material provides by itself (that is, without polishing) a surface that is smooth.

The thickness of the thin film 3b (when polishing is carried out, the film thickness after polishing) is preferably set in such a way that the combined film thickness together with the thin film 3a provided on the single-crystal silicon carbide substrate 1 (i.e., the thickness of the intervening layer 13) is at least 2 nm and not more than 1μm. That is, when thin films 3a and 3b are made the same thickness, the thickness of thin film 3b is set to preferably at least 1 nm and not more than 0.5 μm (500 nm), more preferably from 10 to 200 nm, even more preferably from 10 to 100 nm, and most preferably from 10 to 50 nm. When thin film 3a is not provided, the thickness of thin film 3b is set to preferably at least 2 nm and not more than 1μm, more preferably from 20 to 400 nm, even more preferably from 20 to 200 nm, and most preferably from 20 to 100 nm. At a combined thickness for thin films 3a and 3b of less than 2 nm, the surface is incompletely covered due to in-plane variability in the film thickness, as a result of which the adhesion in bonding of the single-crystal silicon carbide substrate 1 with the handle substrate 12 may worsen. On the other hand, at a combined thickness greater than 1 μm, when the composite substrate 10 is heated to form a nanocarbon film, numerous defects arise in the nanocarbon film.

Having the material that forms thin film 3b be the same as the material that forms above thin film 3a is desirable because the adhesion of bonding is improved. In thin film formation to create the intervening layer 13, it is possible to omit Step 2 and carry out only Step 3, or to omit Step 3 and carry out only Step 2.

(Step 4: Surface Activation Treatment of Single-Crystal Silicon Carbide Substrate and/or Handle Substrate)

Next, the surfaces of the single-crystal silicon carbide substrate 1 and the handle substrate 12 that are to be bonded, that is, the surfaces of thin film 3a and thin film 3b or the ion implantation side of the single-crystal silicon carbide substrate 1 and the surface of the handle substrate 12, are subjected to plasma activation treatment, vacuum ion-beam treatment or immersion treatment in ozone water.

Of these, when plasma activation treatment is carried out, the single-crystal silicon carbide substrate 1 and/or handle substrate 12 on which treatment up to Step 3 above has been completed are loaded into a vacuum chamber and a plasma-generating gas is introduced into the chamber at reduced pressure, following which the substrates are exposed for about 5 to 10 seconds to high-frequency plasma at about 100 W, thereby plasma-activating the surface. Oxygen gas, hydrogen gas, nitrogen gas, argon gas, a mixed gas thereof or a mixed gas of hydrogen gas and helium gas may be used as the plasma-generating gas.

In the case of vacuum ion-beam treatment, activation treatment is carried out by loading the single-crystal silicon carbide substrate 1 and/or the handle substrate 12 into a high-vacuum chamber, and directing an ion beam of argon or the like at the surfaces to be bonded.

In the case of immersion treatment in ozone water, the single-crystal silicon carbide substrate 1 and/or the handle substrate 12 are immersed in ozone water (water in which ozone gas has been dissolved), thereby activating the surfaces.

These surface activation treatments may be carried out only on the single-crystal silicon carbide substrate 1 or only on the handle substrate 12, although such treatment is preferably carried out on both the single-crystal silicon carbide substrate 1 and the handle substrate 12.

Surface activation treatment may be carried out by any one of the above methods or by combinations thereof. In addition, the sides of the single-crystal silicon carbide substrate 1 and the handle substrate 12 where surface activation treatment is carried out are preferably the sides where bonding is to be carried out, i.e., the surfaces of thin film 3a and thin film 3b.

(Step 5: Bonding of Single-Crystal Silicon Carbide Substrate and Handle Substrate)

Figure 2D:
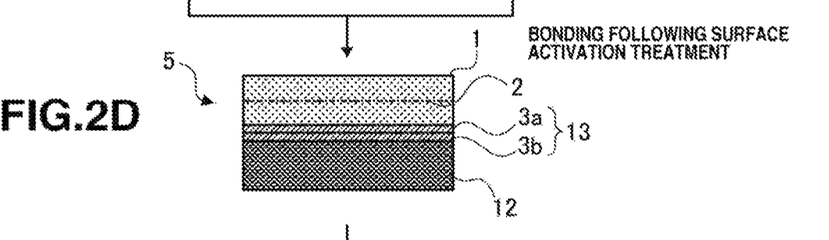

Next, these surface activation-treated surfaces of the single-crystal silicon carbide substrate 1 and the handle substrate 12 (the surfaces of thin films 3a and 3b, or the ion implantation side of the single-crystal silicon carbide substrate 1 and the surface of the handle substrate 12) are bonded together as the bonding surfaces (FIG. 2D).

After the single-crystal silicon carbide substrate 1 and the handle substrate 12 are bonded, heat treatment is carried out at preferably 150 to 350° C., and more preferably 150 to 250° C., thereby increasing the bond strength at the bonding interface, such as at the bonding surfaces of thin films 3a and 3b. Substrate warpage arises at this time due to a difference in the coefficient of thermal expansion between the single-crystal silicon carbide substrate 1 and the handle substrate 12; it is desirable to minimize warpage by using a temperature suitable to each of the materials. The heat treatment time depends to some degree on the temperature as well, with a period of from 2 to 24 hours being preferred.

In this way, thin film 3a and thin film 3b mutually adhere, becoming a single layer that serves as the intervening layer 13 (alternatively, when thin film 3b is not provided, thin film 3a becomes the intervening layer 13; when thin film 3a is not provided, thin film 3b becomes the intervening layer). Moreover, the single-layer silicon carbide substrate 1 and the handle substrate 12 strongly adhere to one other through the intervening layer 13, forming a bonded substrate 5.

(Step 6: Exfoliation Treatment)

Figure 2E:
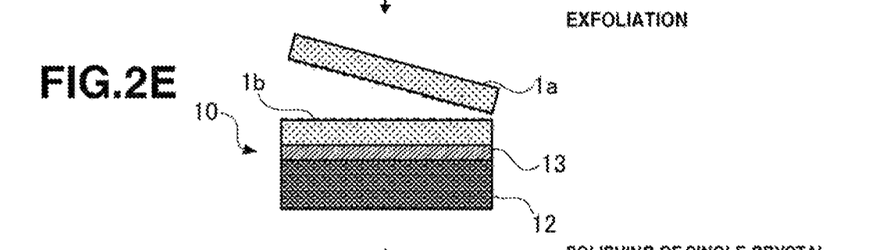

After the single-crystal silicon carbide substrate 1 and the handle substrate 12 have been bonded together and the bonding strength has been increased, thermal energy or mechanical energy is imparted to the region that was ion-implanted, inducing exfoliation of the single-crystal silicon carbide substrate 1a at the ion implant region 2 and thereby producing a composite substrate 10 having the single-crystal silicon carbide thin film 1b on the handle substrate 12 (FIG. 2E).

The exfoliation method used may be, for example, a thermal exfoliation process that involves heating the bonded substrate 5 to an elevated temperature, which heat generates tiny bubbles of the ion-implanted constituent within the ion implant region 2, causing exfoliation to arise and thereby separating off a single-crystal silicon carbide substrate 1a. Alternatively, use may be made of a mechanical exfoliation process in which, while carrying out low-temperature heat treatment of a degree that does not induce thermal exfoliation (e.g., 500 to 900° C., and preferably 500 to 700° C.), a physical impact is applied to one end of the ion implant region 2, inducing mechanical exfoliation and thereby separating off a single-crystal silicon carbide substrate 1a. The mechanical exfoliation process is more preferable because the roughness of the transfer surface following single-crystal silicon carbide thin film transfer is relatively low compared with the surface obtained by thermal exfoliation.

Following exfoliation treatment, heat treatment to improve adhesion between the single-crystal silicon carbide thin film 1b and the handle substrate 12 may be carried out by heating the composite substrate 10 at a temperature of from 700 to 1,000° C. which is higher than that during exfoliation treatment, for a heating time of 1 to 24 hours.

At this time, because thin film 3a and thin film 3b firmly adhere to one another, and moreover because thin film 3a firmly adheres to the single-crystal silicon carbide substrate 1 and thin film 3b firmly adheres to the handle substrate 12, exfoliation in places other than the area of exfoliation at the ion implant region 2 does not arise. In cases where thin film 3b is not provided, because the thin film 3a adheres strongly to the single-crystal silicon carbide substrate 1 and the handle substrate 12, exfoliation in places other than the area of exfoliation at the ion implant region 2 does not arise. In cases where thin film 3a is not provided, because the thin film 3b adheres strongly to the single-crystal silicon carbide substrate 1 and the handle substrate 12, exfoliation in places other than the area of exfoliation at the ion implant region 2 does not arise.

The single-crystal silicon carbide substrate 1a following exfoliation, when the surface is again subjected to polishing, cleaning and the like, can be reused as a bonding substrate in this method for producing a composite substrate.

(Step 7: Polishing of Single-Crystal Silicon Carbide Thin Film)

Figure 2F:
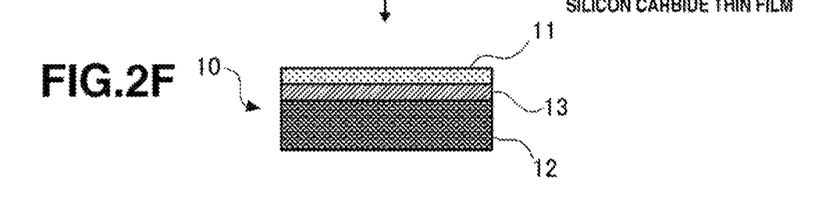

The single-crystal silicon carbide thin film 1b surface on the handle substrate 12 is mirror finished (FIG. 2F). Specifically, the single-crystal silicon carbide thin film 1b is subjected to chemical mechanical polishing (CMP) to remove ion implant regions remaining on the surface, thereby finishing it to a mirror-like single-crystal silicon carbide thin film 11. The CMP process employed here may be a known CMP polishing process used for planarizing silicon wafers.

By carrying out the above steps, it is possible to obtain the composite substrate 10 of the invention.

EXAMPLES

The invention is illustrated more fully below by way of Working Examples and Comparative Examples, although these Working Examples are not intended to limit the invention.

The thicknesses of the single-crystal silicon carbide thin film and the intervening layer were measured by reflectance spectroscopy.

Working Example 1

A commercial 3-inch diameter single-crystal silicon carbide wafer (4H polytype; thickness, 400 μm) was provided as the single-crystal silicon carbide substrate 1, and the wafer was implanted with hydrogen ions ($H^+$) at 100 KeV and a dose of $8.8 \times 10^{16}$ atoms/cm$^2$.

Next, a 3 inch-diameter amorphous silicon carbide wafer (thickness, 400 μm) was provided as the handle substrate 12 and a silicon oxide ($SiO_2$) thin film was formed as the thin film 3b (intervening layer 13) to varying thicknesses on the principal side thereof by PECVD, following which the thin film was polished by CMP. The thickness of the silicon oxide thin film after polishing was set to the following nine levels: 0.02, 0.1, 0.5, 0.8, 0.9, 1.0, 1.2, 1.5 and 2.0 μm.

Subsequently, the surface of the single-crystal silicon carbide substrate where ion implantation was carried out and the side of the handle substrate having the thin film formed thereon were both subjected to plasma activation surface treatment, after which the two were bonded together to form a bonded body.

The bonded body was heated to 500° C. and a mechanical impact was applied to one end of the ion implant region, inducing exfoliation at the ion implant region. Nine composite substrates in which a single-crystal silicon carbide thin film was transferred, over an intervening silicon oxide thin film, to an amorphous silicon carbide wafer were obtained in this way. In each composite substrate, the thickness of the single-crystal silicon carbide thin film at this time was set to 0.95 μm.

The resulting composite substrates were heated to 1,420° C. in an inert gas atmosphere, thereby carrying out graphenization of the single-crystal silicon carbide thin film.

Figure 3:
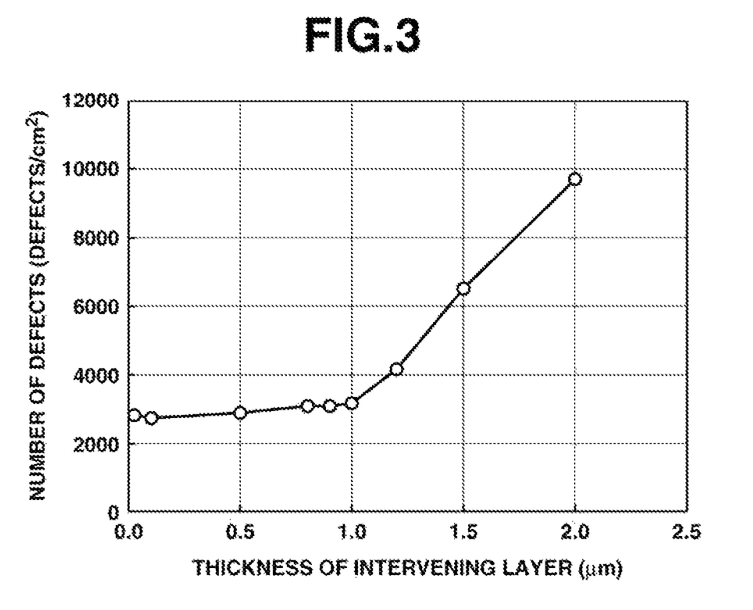
FIG. 3 is a graph showing the results from Working Example 1.

Following graphene film formation, the surface of the graphene film was examined under an optical microscope at a magnification of 1,000× and the number of pits was visually counted as the number of defects. The results are presented in Table 1 and FIG. 3. At an intervening layer thickness of 1 μm or less, the number of defects was about 3,000/cm$^2$. However, at a thickness greater than 1 μm, the number of defects rose to more than 4,000/cm$^2$.

TABLE 1

| Intervening layer thickness (μm) | Number of defects (number/cm$^2$) |
|---|---|
| 0.02 | 2,830 |
| 0.1 | 2,750 |
| 0.5 | 2,910 |
| 0.8 | 3,090 |
| 0.9 | 3,110 |

TABLE 1-continued

| Intervening layer thickness (μm) | Number of defects (number/cm²) |
|---|---|
| 1.0 | 3,190 |
| 1.2 | 4,180 |
| 1.5 | 6,520 |
| 2.0 | 9,690 |

Working Example 2

A commercial 3-inch diameter single-crystal silicon carbide wafer (4H polytype; thickness, 400 μm) was provided as the single-crystal silicon carbide substrate 1, and the wafer was implanted with hydrogen ions (H⁺) at 100 KeV and a dose of $8.8 \times 10^{16}$ atoms/cm².

Next, a titanium (Ti) thin film and a 10 nm thick gold (Au) thin film were formed by electron-beam evaporation as the thin film 3a on this single-crystal silicon carbide substrate 1. The thickness of the titanium thin film was varied over nine levels: 0, 40, 240, 390, 440, 490, 590, 740 and 990 nm.

Next, a 3 inch-diameter polycrystalline silicon carbide wafer (thickness, 400 μm) was provided as the handle substrate 12 and a titanium (Ti) thin film and a 10 nm thick gold (Au) thin film were formed by electron-beam evaporation as the thin film 3b on the principal side thereof. The thickness of this titanium thin film was made the same as the thickness of the titanium thin film in the above thin film 3a. The combined thickness of thin films 3a and 3b after bonding (thickness of intervening layer 13) was thereby set to the following nine levels: 0.02, 0.1, 0.5, 0.8, 0.9, 1.0, 1.2, 1.5 and 2.0 μm.

Subsequently, the side of the single-crystal silicon carbide substrate having thin films formed thereon and the side of the handle substrate having thin films formed thereon were both subjected to plasma activation surface treatment, following which the two were bonded together to form a bonded body.

The bonded body was heated to 500° C. and a mechanical impact was applied to one end of the ion implant region, inducing exfoliation at the ion implant region. Nine composite substrates in which a single-crystal silicon carbide thin film was transferred, over an intervening layer (a thin film having an Au/Au two-layer structure or a Ti/Au/Au/Ti four-layer structure), to a polycrystalline silicon carbide wafer were obtained in this way. In each composite substrate, the thickness of the single-crystal silicon carbide thin film at this time was set to 0.95 μm.

The resulting composite substrates were heated to 1,420° C. in an inert gas atmosphere, thereby carrying out graphenization of the single-crystal silicon carbide thin film.

Figure 4:
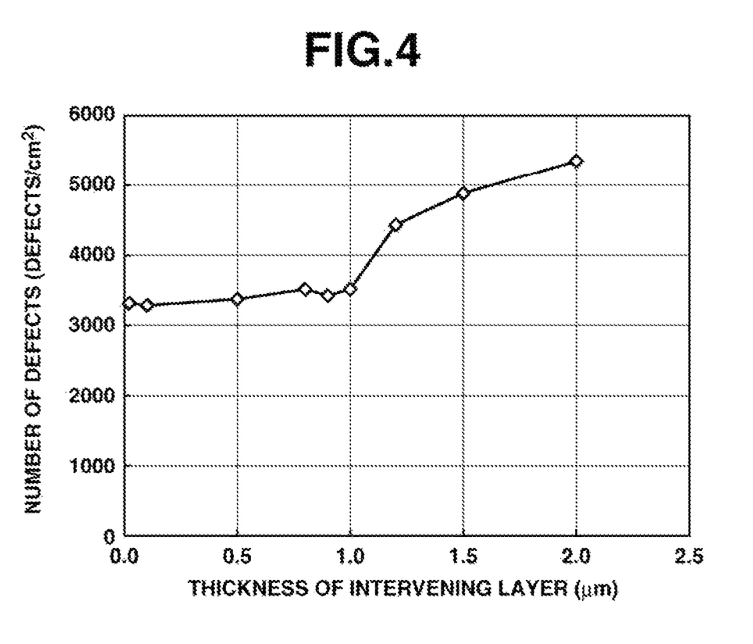
FIG. 4 is a graph showing the results from Working Example 2.

Following graphene film formation, the surface of the graphene film was examined under an optical microscope at a magnification of 1,000× and the number of pits was visually counted as the number of defects. The results are presented in Table 2 and FIG. 4. At an intervening layer thickness of 1μm or less, the number of defects was from about 3,300/cm² to about 3,500/cm². However, at a thickness greater than 1 μm, the number of defects rose to more than 4,000/cm².

TABLE 2

| Intervening layer thickness (μm) | Number of defects (number/cm²) |
|---|---|
| 0.02 | 3,310 |
| 0.1 | 3,280 |
| 0.5 | 3,370 |
| 0.8 | 3,510 |
| 0.9 | 3,420 |
| 1.0 | 3,510 |
| 1.2 | 4,430 |
| 1.5 | 4,880 |
| 2.0 | 5,350 |

Comparative Example 1

Aside from setting the thickness of the titanium thin film in each of thin films 3a and 3b to 80 nm and setting the thickness of the single-crystal silicon carbide thin film 11 to 1.04 μm, a composite substrate was formed in the same way as in Working Example 2.

The resulting composite substrate was heated to 1,420° C. in an inert gas atmosphere, thereby carrying out graphenization of the single-crystal silicon carbide thin film.

Following graphene film formation, the surface of the graphene film was examined under an optical microscope at a magnification of 1,000× and the number of pits was visually counted as the number of defects. The result obtained was 4,520/cm².

Working Example 3

In the method for producing the composite substrate of the invention, composite substrates were produced as described below by forming six types of thin films 3a and 3b on, respectively, the single-crystal silicon carbide substrate 1 and the handle substrate 12.

Working Example 3-1

A commercial 3-inch diameter single-crystal silicon carbide wafer (4H polytype; thickness, 400 μm) was provided as the single-crystal silicon carbide substrate 1, and the wafer was implanted with hydrogen ions (H⁺) at 100 KeV and a dose of $8.8 \times 10^{16}$ atoms/cm².

Next, a 100 nm thick silicon oxide (SiO₂) thin film was formed as thin film 3a on the ion implantation side of this single-crystal silicon carbide substrate 1 by PECVD, following which this thin film was polished by CMP.

Next, a 3 inch-diameter polycrystalline silicon carbide wafer (thickness, 400 μm) was provided as the handle substrate 12 and a 100 nm thick silicon oxide (SiO₂) thin film was formed as the thin film 3b on the principal side thereof by PECVD, following which this thin film was polished by CMP.

Subsequently, the side of the single-crystal silicon carbide substrate having a thin film formed thereon and the side of the handle substrate having a thin film formed thereon were both subjected to plasma activation surface treatment, following which the two were bonded together to form a bonded body.

Next, mechanical exfoliation was induced at the ion implant region in this bonded body, thereby giving a composite substrate in which a single-crystal silicon carbide thin film (thickness, 0.65 μm) was transferred, over an intervening silicon oxide thin film, onto a polycrystalline silicon carbide wafer.

The resulting composite substrate was heat-treated at 500° C., following which a peel test was carried out in which pressure-sensitive adhesive tape (available under the trade name Kapton Tape from DuPont K.K.) was attached to the single-crystal silicon carbide thin film and then peeled off, and the presence or absence of peeling by the single-crystal silicon carbide thin film was determined. No peeling of the single-crystal silicon carbide thin film was observed, indicating that adhesion through the intervening layer was good.

Graphenization was then carried out in the same way as in Working Example 2. The number of defects in the graphene film were counted and found to be 3,080/cm$^2$.

Working Example 3-2

Aside from forming 100 nm thick silicon nitride (SiN) thin films by a sputtering process as thin films 3a and 3b and subsequently polishing and finishing these thin films by CMP, a composite substrate was produced in the same way as in Working Example 3-1.

This gave a composite substrate in which a single-crystal silicon carbide thin film was transferred, over intervening silicon nitride thin films, onto a polycrystalline silicon carbide wafer. The same peel test as in Working Example 3-1 was carried out on the resulting composite substrate, whereupon peeling of the single-crystal silicon carbide thin film was not observed, indicating that adhesion through the intervening layer was good.

Graphenization was then carried out in the same way as in Working Example 2. The number of defects in the graphene film were counted and found to be 3,480/cm$^2$.

Working Example 3-3

Aside from forming 100 nm thick amorphous silicon carbide (SiC) thin films by a sputtering process as thin films 3a and 3b and subsequently polishing and finishing these thin films by CMP, a composite substrate was produced in the same way as in Working Example 3-1.

This gave a composite substrate in which a single-crystal silicon carbide thin film was transferred, over intervening silicon nitride thin films, onto a polycrystalline silicon carbide wafer. The same peel test as in Working Example 3-1 was carried out on the resulting composite substrate, whereupon peeling of the single-crystal silicon carbide thin film was not observed, indicating that adhesion through the intervening layer was good.

Graphenization was then carried out in the same way as in Working Example 2. The number of defects in the graphene film were counted and found to be 3,320/cm$^2$.

Working Example 3-4

Aside from forming 100 nm thick amorphous silicon (Si) thin films by a sputtering process as thin films 3a and 3b and subsequently polishing and finishing these thin films by CMP, a composite substrate was produced in the same way as in Working Example 3-1.

This gave a composite substrate in which a single-crystal silicon carbide thin film was transferred, over intervening silicon thin films, onto a polycrystalline silicon carbide wafer. The same peel test as in Working Example 3-1 was carried out on the resulting composite substrate, whereupon peeling of the single-crystal silicon carbide thin film was not observed, indicating that adhesion through the intervening layer was good.

Graphenization was then carried out in the same way as in Working Example 2. The number of defects in the graphene film were counted and found to be 3,290/cm$^2$.

Working Example 3-5

Aside from forming 20 nm thick titanium (Ti) thin films by electron-beam evaporation as thin films 3a and 3b and using these directly without subsequent CMP treatment, a composite substrate was produced in the same way as in Working Example 3-1.

This gave a composite substrate in which a single-crystal silicon carbide thin film was transferred, over intervening titanium thin films, onto a polycrystalline silicon carbide wafer. The same peel test as in Working Example 3-1 was carried out on the resulting composite substrate, whereupon peeling of the single-crystal silicon carbide thin film was not observed, indicating that adhesion through the intervening layer was good.

Graphenization was then carried out in the same way as in Working Example 2. The number of defects in the graphene film were counted and found to be 3,310/cm$^2$.

Working Example 3-6

Aside from forming, by electron-beam evaporation in each case, both a 20 nm thick titanium (Ti) thin film and a 20 mm thick gold (Au) thin film as thin film 3a and as thin film 3b, and using these directly without subsequent CMP treatment, a composite substrate was produced in the same way as in Working Example 3-1.

This gave a composite substrate in which a single-crystal silicon carbide thin film was transferred, over an intervening multilayer thin film consisting of titanium thin films and gold thin films (a thin film having the four-layer structure Ti/Au/Au/Ti), onto a polycrystalline silicon carbide wafer. The same peel test as in Working Example 3-1 was carried out on the resulting composite substrate, whereupon peeling of the single-crystal silicon carbide thin film was not observed, indicating that adhesion through the intervening layer was good.

Graphenization was then carried out in the same way as in Working Example 2. The number of defects in the graphene film were counted and found to be 2,290/cm$^2$.

Working Example 4

Aside from using a 3-inch diameter amorphous silicon carbide wafer (thickness, 400 μm) as the handle substrate 12, composite substrates were produced in the same way as in Working Example 3. Also, a Working Example using zirconium oxide (zirconia, ZrO$_2$) as the intervening layer material was added. The details appear below.

Working Example 4-1

Aside from using a 3-inch diameter amorphous silicon carbide wafer (thickness, 400 μm) as the handle substrate 12, a composite substrate was produced in the same way as in Working Example 3-1.

This gave a composite substrate in which a single-crystal silicon carbide thin film was transferred, over intervening silicon oxide thin films, onto an amorphous silicon carbide wafer. The same peel test as in Working Example 3-1 was carried out on the resulting composite substrate, whereupon peeling of the single-crystal silicon carbide thin film was not observed, indicating that adhesion through the intervening layer was good.

Graphenization was then carried out in the same way as in Working Example 2. The number of defects in the graphene film were counted and found to be 3,470/cm$^2$.

Working Example 4-2

Aside from using a 3-inch diameter amorphous silicon carbide wafer (thickness, 400 µm) as the handle substrate 12, a composite substrate was produced in the same way as in Working Example 3-2.

This gave a composite substrate in which a single-crystal silicon carbide thin film was transferred, over intervening silicon nitride thin films, onto an amorphous silicon carbide wafer. The same peel test as in Working Example 3-1 was carried out on the resulting composite substrate, whereupon peeling of the single-crystal silicon carbide thin film was not observed, indicating that adhesion through the intervening layer was good.

Graphenization was then carried out in the same way as in Working Example 2. The number of defects in the graphene film were counted and found to be 3,220/cm$^2$.

Working Example 4-3

Aside from using a 3-inch diameter amorphous silicon carbide wafer (thickness, 400 µm) as the handle substrate 12, a composite substrate was produced in the same way as in Working Example 3-3.

This gave a composite substrate in which a single-crystal silicon carbide thin film was transferred, over intervening silicon carbide thin films, onto an amorphous silicon carbide wafer. The same peel test as in Working Example 3-1 was carried out on the resulting composite substrate, whereupon peeling of the single-crystal silicon carbide thin film was not observed, indicating that adhesion through the intervening layer was good.

Graphenization was then carried out in the same way as in Working Example 2. The number of defects in the graphene film were counted and found to be 3,400/cm$^2$.

Working Example 4-4

Aside from using a 3-inch diameter amorphous silicon carbide wafer (thickness, 400 µm) as the handle substrate 12, a composite substrate was produced in the same way as in Working Example 3-4.

This gave a composite substrate in which a single-crystal silicon carbide thin film was transferred, over intervening silicon thin films, onto an amorphous silicon carbide wafer. The same peel test as in Working Example 3-1 was carried out on the resulting composite substrate, whereupon peeling of the single-crystal silicon carbide thin film was not observed, indicating that adhesion through the intervening layer was good.

Graphenization was then carried out in the same way as in Working Example 2. The number of defects in the graphene film were counted and found to be 3,360/cm$^2$.

Working Example 4-5

Aside from using a 3-inch diameter amorphous silicon carbide wafer (thickness, 400 µm) as the handle substrate 12, a composite substrate was produced in the same way as in Working Example 3-5.

This gave a composite substrate in which a single-crystal silicon carbide thin film was transferred, over intervening titanium thin films, onto an amorphous silicon carbide wafer. The same peel test as in Working Example 3-1 was carried out on the resulting composite substrate, whereupon peeling of the single-crystal silicon carbide thin film was not observed, indicating that adhesion through the intervening layer was good.

Graphenization was then carried out in the same way as in Working Example 2. The number of defects in the graphene film were counted and found to be 3,310/cm$^2$.

Working Example 4-6

Aside from using a 3-inch diameter amorphous silicon carbide wafer (thickness, 400 µm) as the handle substrate 12, a composite substrate was produced in the same way as in Working Example 3-6.

This gave a composite substrate in which a single-crystal silicon carbide thin film was transferred, over an intervening multilayer thin film consisting of titanium thin films and gold thin films (a thin film having the four-layer structure Ti/Au/Au/Ti), onto an amorphous silicon carbide wafer. The same peel test as in Working Example 3-1 was carried out on the resulting composite substrate, whereupon peeling of the single-crystal silicon carbide thin film was not observed, indicating that adhesion through the intervening layer was good.

Graphenization was then carried out in the same way as in Working Example 2. The number of defects in the graphene film were counted and found to be 3,020/cm$^2$.

Working Example 4-7

Aside from forming, by a sputtering process, 100 nm thick zirconium oxide (ZrO$_2$) thin films as thin films 3a and 3b and subsequently polishing and finishing these thin films by CMP, a composite substrate was produced in the same way as in Working Example 4-1.

This gave a composite substrate in which a single-crystal silicon carbide thin film was transferred, over intervening zirconium oxide thin films, onto an amorphous silicon carbide wafer. The same peel test as in Working Example 3-1 was carried out on the resulting composite substrate, whereupon peeling of the single-crystal silicon carbide thin film was not observed, indicating that adhesion through the intervening layer was good.

Graphenization was then carried out in the same way as in Working Example 2. The number of defects in the graphene film were counted and found to be 3,530/cm$^2$.

Working Example 5

Aside from using four types of handle substrate 12, composite substrates were produced in the same way as in Working Example 3-6. The details appear below.

Working Example 5-1

Aside from using a 3-inch diameter single-crystal silicon wafer (thickness, 400 µm) as the handle substrate 12, a composite substrate was produced in the same way as in Working Example 3-6.

This gave a composite substrate in which a single-crystal silicon carbide thin film was transferred, over an intervening multilayer thin film of titanium thin films and gold thin films (a thin film having the four-layer structure Ti/Au/Au/Ti), onto a single-crystal silicon wafer. The same peel test as in Working Example 3-1 was carried out on the resulting composite substrate, whereupon peeling of the single-crystal silicon carbide thin film was not observed, indicating that adhesion through the intervening layer was good.

Graphenization was then carried out in the same way as in Working Example 2. The number of defects in the graphene film were counted and found to be 3,210/cm$^2$.

Working Example 5-2

Aside from using a 3-inch diameter polycrystalline aluminum oxide (alumina) wafer (thickness, 400 μm) as the handle substrate 12, a composite substrate was produced in the same way as in Working Example 3-6.

This gave a composite substrate in which a single-crystal silicon carbide thin film was transferred, over an intervening multilayer thin film consisting of titanium thin films and gold thin films (a thin film having the four-layer structure Ti/Au/Au/Ti), onto a polycrystalline aluminum oxide wafer. The same peel test as in Working Example 3-1 was carried out on the resulting composite substrate, whereupon peeling of the single-crystal silicon carbide thin film was not observed, indicating that adhesion through the intervening layer was good.

Graphenization was then carried out in the same way as in Working Example 2. The number of defects in the graphene film were counted and found to be 3,440/cm$^2$.

Working Example 5-3

Aside from using a 3-inch diameter polycrystalline silicon nitride wafer (thickness, 400 μm) as the handle substrate 12, a composite substrate was produced in the same way as in Working Example 3-6.

This gave a composite substrate in which a single-crystal silicon carbide thin film was transferred, over a multilayer thin film of titanium thin films and gold thin films (a thin film having the four-layer structure Ti/Au/Au/Ti), onto a polycrystalline silicon nitride wafer. The same peel test as in Working Example 3-1 was carried out on the resulting composite substrate, whereupon peeling of the single-crystal silicon carbide thin film was not observed, indicating that adhesion through the intervening layer was good.

Graphenization was then carried out in the same way as in Working Example 2. The number of defects in the graphene film were counted and found to be 3,330/cm$^2$.

Working Example 5-4

Aside from using a 3-inch diameter polycrystalline aluminum nitride wafer (thickness, 400 μm) as the handle substrate 12, a composite substrate was produced in the same way as in Working Example 3-6.

This gave a composite substrate in which a single-crystal silicon carbide thin film was transferred, over an intervening multilayer thin film consisting of titanium thin films and gold thin films (a thin film having the four-layer structure Ti/Au/Au/Ti), onto a polycrystalline aluminum nitride wafer. The same peel test as in Working Example 3-1 was carried out on the resulting composite substrate, whereupon peeling of the single-crystal silicon carbide thin film was not observed, indicating that adhesion through the intervening layer was good.

Graphenization was then carried out in the same way as in Working Example 2. The number of defects in the graphene film were counted and found to be 3,490/cm$^2$.

Comparative Example 2

A commercial 3-inch diameter single-crystal silicon carbide wafer (4H polytype; thickness, 400 μm) was provided as the single-crystal silicon carbide substrate 1, and the wafer was implanted with hydrogen ions (H$^+$) at 100 KeV and a dose of 8.8×10$^{16}$ atoms/cm$^2$. The ion implantation side of the single-crystal silicon carbide wafer was polished by CMP. The surface roughness RMS thereof was 0.95 nm.

The surface roughness RMS was determined by measuring the surface of the substrate with an atomic force microscope (AFM). The field of measurement was set to 10 μm×10 μm.

Next, a 3 inch-diameter polycrystalline silicon carbide wafer (thickness, 400 μm) was provided as the handle substrate 12. The surface of the polycrystalline silicon carbide wafer was polished by CMP, resulting in a surface roughness RMS of 1.05 nm.

Subsequently, the surface of the single-crystal silicon carbide substrate where ion implantation was carried out and the side of the handle substrate that is to be bonded were both subjected to plasma activation surface treatment, after which the two were bonded together to form a bonded body.

Next, mechanical exfoliation was induced at the ion implant region of the assembly, thereby giving a composite substrate in which a single-crystal silicon carbide thin film was transferred onto a polycrystalline silicon carbide wafer.

A peel test like that in Working Example 3-1 was carried out on the resulting composite substrate, whereupon peeling arose in part of the single-crystal silicon carbide thin film. This demonstrated that sufficient bond strength is not obtained between the single-crystal silicon carbide thin film and the handle substrate when they are bonded together without an intervening layer.

Although some preferred embodiments of the invention have been described above, the invention is not limited thereby, various modifications such as other embodiments, additions, deletions and substitutions being possible within a range conceivable by those skilled in the art, insofar as all such variations exhibit the operation and advantageous effects of the invention and are encompassed within the scope of the invention.

REFERENCE SIGNS LIST

1, 1a Single-crystal silicon carbide substrate
1b, 11 Single-crystal silicon carbide thin film
2 Ion implant region
3a, 3b Thin films
5 Bonded substrates
10 Composite substrate
12 Handle substrate
13 Intervening layer

The invention claimed is:
1. A composite substrate, comprising:
a single-crystal silicon carbide thin film having a thickness of not more than 1 μm,
a handle substrate which supports the single-crystal silicon carbide thin film and is made of a heat-resistant material (exclusive of single-crystal silicon carbide) that is heat resistant to at least 1,100° C., and
an intervening layer having a thickness of at least 2 nm and not more than 1 nm that is provided between the single-crystal silicon carbide thin film and the handle substrate and is made of at least one metallic material selected from the group consisting of titanium, gold, silver, copper, cobalt, iron, chromium, zirconium, molybdenum, tantalum and tungsten.

2. The composite substrate of claim 1, wherein the handle substrate is made of amorphous silicon carbide, polycrystalline silicon carbide, quartz glass, sapphire, silicon nitride, aluminum nitride, silicon or diamond.

3. The composite substrate of claim 1, wherein the single-crystal silicon carbide thin film is an exfoliation-transferred film of single-crystal silicon carbide.

4. The composite substrate of claim 1, wherein the single-crystal silicon carbide thin film has a thickness of at least 200 nm and not more than 800 nm.

5. The composite substrate of claim 1, wherein the intervening layer has a thickness of at least 0.02 μm and not more than 0.5 μm.

6. The composite substrate of claim 1, wherein the intervening layer is (i) a single layer of titanium, (ii) a single layer of zirconium, (iii) multiple layers consisting of a titanium layer and a gold layer, or (iv) multiple layers consisting of a zirconium layer and a gold layer.

7. The composite substrate of claim 1, further comprising a nanocarbon film in the surface side of the single-crystal silicon carbide thin film.

8. The composite substrate of claim 7, wherein the nanocarbon film is a film in which silicon atoms are sublimated from the single-crystal silicon carbide thin film.

9. The composite substrate of claim 7, wherein the nanocarbon film comprises a nanocarbon selected from the group consisting of fullerenes, graphenes, carbon nanotubes, and a mixture of two or more of fullerenes, graphenes and carbon nanotubes.

10. The composite substrate of claim 7, wherein the number of defects found by surface examination of the nanocarbon film under an optical microscope at 1,000× is not more than 4,000 defects/cm$^2$.

11. A method of forming a nanocarbon film, comprising the step of heating the composite substrate of claim 1 and thereby sublimating silicon atoms from the single-crystal silicon carbide thin film so as to obtain a nanocarbon film.

* * * * *